US009571039B2

(12) United States Patent
Doy

(10) Patent No.: US 9,571,039 B2
(45) Date of Patent: Feb. 14, 2017

(54) GROUP AWARE CURRENT-LIMITED AMPLIFIER AND SYSTEM

(71) Applicant: Maxim Integrated Products, Inc., San Jose, CA (US)

(72) Inventor: Anthony S. Doy, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/864,471

(22) Filed: Sep. 24, 2015

(65) Prior Publication Data

US 2016/0126899 A1 May 5, 2016

Related U.S. Application Data

(60) Provisional application No. 62/073,950, filed on Oct. 31, 2014.

(51) Int. Cl.
*H03F 99/00* (2009.01)
*H03F 1/02* (2006.01)
*H03F 3/183* (2006.01)
*H03F 3/68* (2006.01)

(52) U.S. Cl.
CPC .............. *H03F 1/0211* (2013.01); *H03F 3/183* (2013.01); *H03F 3/68* (2013.01); *H03F 2200/03* (2013.01); *H03F 2200/321* (2013.01)

(58) Field of Classification Search
CPC .......... H03F 1/0211; H03F 3/183; H03F 3/68; H03F 2200/03; H03F 2200/321
See application file for complete search history.

(56) References Cited

U.S. PATENT DOCUMENTS

| 5,724,003 A * | 3/1998 | Jensen ..................... G06G 7/24 330/129 |
| 6,430,402 B1* | 8/2002 | Agahi-Kesheh .......... H03F 1/34 330/129 |
| 9,367,502 B1* | 6/2016 | Ashrafzadeh ......... G06F 13/385 |
| 2004/0100748 A1* | 5/2004 | Liu ........................... H04B 1/38 361/93.1 |
| 2004/0104759 A1* | 6/2004 | Nakamori ............ H03M 1/002 327/530 |
| 2010/0182034 A1* | 7/2010 | Kim ................... G01R 31/2641 324/762.01 |

\* cited by examiner

*Primary Examiner* — Simon Sing
(74) *Attorney, Agent, or Firm* — TIPS Group

(57) ABSTRACT

A group-aware, current limited amplifier system including a group brownout control bus and a number of current-limited amplification channels coupled to the group brownout control bus. In an example embodiment, each current-limited amplification channel includes an amplifier, an amplifier power supply developing a current level signal that represents the amount of current being drawn by the amplifier, a brownout controller responsive to a digital audio input, the group brownout control bus, and the current level signal, and operative to develop a control signal; and an audio digital-to-analog (D/A) converter responsive to the digital audio input and to the control signal and operative to develop an analog audio output that is coupled to an input of the amplifier.

13 Claims, 4 Drawing Sheets

GROUP AWARE CURRENT-LIMITED AMPLIFIER AND SYSTEM

CROSS REFERENCE TO RELATED APPLICATIONS

This application claims the benefit of U.S. Provisional Patent Application Ser. No. 62/073,950, filed Oct. 31, 2014, which is incorporated herein by reference.

BACKGROUND

In mobile (battery powered) products, some system designers approach low battery operation by only allowing certain blocks and partitions of a system and/or amplifier to take up to a maximum current. This prevents brownout or reset of the main processor(s) due to the battery voltage collapsing on peaks. With mono-audio amplifier instantiations, a simple maximum current limit can be defined, reacting to audio peaks and providing graceful degradation to the audio material in the presence of peaks.

The problem of boosted amplifiers potentially triggering reset events at low battery is well established for mono-amplifiers. For example, some systems are designed to have an automatic level control ("ALC") gain reduction block that is triggered by low battery conditions. This pulls down the gain of the amplifier, preventing any audio peaks from causing a reset. Also, at the system level, some attempts have been made to have the various partitioned blocks in a mobile device have a "pre-reset" bus warning i.e., an attempt to alert other devices that have asynchronous current demands to restrict current draw at key times.

The limitation of the prior art, for audio implementations, is that on larger (or tablet format) mobile devices where more than one amplifier is used, each amplifier has to make its own peak current limit decisions independently, even though the audio they are playing is most likely coherent in nature (for example, in stereo replay). Any attempt of one channel to limit audio peaks, based on the local version of battery voltage and program material, is likely to degrade or eliminate stereo imaging or otherwise degrade the audible experience, since the limiting behavior of other channels is unknown.

As noted above, due to the distributed nature of power and GND planes, as well non-idealities in determining battery voltage, different amplifiers in a system may well experience different battery supply voltages. For example, if one channel is on the verge of detecting a low battery event, another channel may already switch to a "protect mode," due to tolerances and/or local IxR drops. This makes dealing with the problem of low battery operation in such systems difficult.

These and other limitations of the prior art will become apparent to those of skill in the art upon a reading of the following descriptions and a study of the several figures of the drawing.

SUMMARY

In an embodiment, set forth by way of example and not limitation, a group of amplifiers share a common audio interface and communications bus such that they are aware of both audio content and current demand of the group of amplifiers and can take action to limit the overall current draw of the group, as well as manage any audio degradation in a holistic manner.

In certain example embodiments, intra-chip or inter-chip communication protocols are used such that amplifiers can be grouped together in order to calculate peak cumulative current usage. In an embodiment, set forth by way of example and not limitation an extra communication channel is added to a given digital audio interface protocol, e.g. physically, with an added pin, virtually, by adding an effective channel. With such embodiment, each amplifier has access to the audio and current demands of all of the other amplifiers.

In an embodiment, set forth by way of example and not limitation, a TDM (Time Division Multiplexed) digital audio interface is used, where each channel is allocated a slot within the Digital Audio frame. Other interfaces, combining both audio data and control, are used in still further example embodiments, and may be preferred in some example applications.

In certain example embodiments, a mutually distributed upper protection trigger level (wherein each amplifier calculates the group limit) is employed. In other example embodiments, a master/slave relationship is employed, where a master calculates the limit and controls each slave to meet a cumulative limit.

Certain example embodiments operate in an "open loop" configuration where a processor that knows what audio is being played and on what channel and the precise voltage available to each amplifier can allow for the tolerance, the replay delay, etc., for each amplifier, such that it controls the audio fed to each amplifier in a "feed forward" fashion.

In an embodiment, set forth by way of example but not limitation, a current-limited amplification device includes: an amplifier having an analog audio input and an amplified analog audio output; an amplifier power supply coupled to the amplifier and developing a current level signal that represents the amount of current being drawn by the amplifier; a brownout controller responsive to a digital audio input and the current level signal, the brownout controller being operative to develop a control signal; and an audio digital-to-analog (D/A) converter responsive to the digital audio input and to the control signal, the D/A converter being operative to develop an analog audio output that is coupled to the analog audio input of the amplifier.

In an embodiment, set forth by way of example but not limitation, a group-aware, current limited amplifier system includes: a group brownout control bus; and a plurality of Current-limited amplification channels coupled to the group brownout control bus, each including (a) an amplifier having an analog audio input and an amplified analog audio output; (b) an amplifier power supply coupled to the amplifier and developing a current level signal that represents the amount of current being drawn by the amplifier; (c) a brownout controller responsive to a digital audio input, the group brownout control bus, and the current level signal, the brownout controller being operative to develop a control signal; and (d) an audio digital-to-analog (D/A) converter responsive to the digital audio input and to the control signal, the D/A converter being operative to develop an analog audio output that is coupled to the analog audio input of the amplifier.

In an embodiment, set forth by way of example and not limitation, a method for current limiting a multichannel amplifier system includes: designating one of a plurality of amplifier channels as a master amplifier channel, each of the remaining amplifier channels being a slave amplifier channel, wherein each of the plurality of amplifier channels has an amplifier which provides a channel path gain; and, for each slave amplifier channel, (a) waiting for a new digital audio sample; (b) determining the current being presently drawn by the amplifier; (c) predicting the current that will be drawn by the amplifier based, at least in part, on the new digital audio sample; (d) transmitting channel current and gain data to the master amplifier channel; (e) comparing the predicted current to a current limit for the amplifier channel; and (f) reducing the path gain for the channel if the predicted current is greater than the current limit.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1:
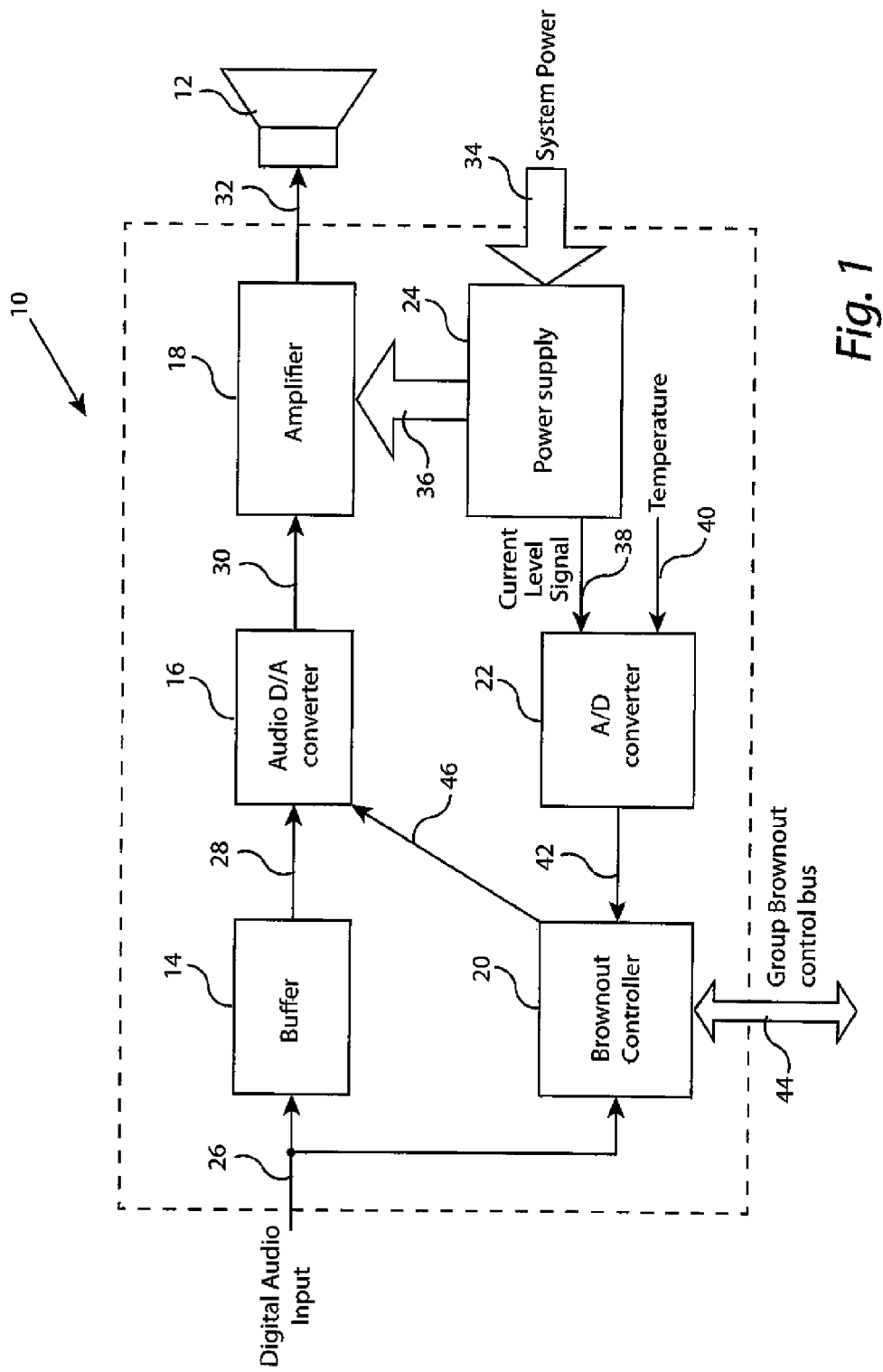
FIG. 1 is a block diagram of an example group-aware, current limited amplifier.

In FIG. 1, an example group-aware, current-limited amplifier channel 10 is coupled to an electro-acoustic speaker 12. In this embodiment, set forth by way of example and not limitation, current-limited amplifier channel 10 includes a buffer 14, an audio digital-to-analog (D/A) converter 16, an amplifier 18, a brownout controller 20, an analog-to-digital (A/D) converter 22, and a power supply 24. A digital audio input developed on an input line 26 is fed into both the buffer 14 and the brownout controller 20. A line 28 couples an output of buffer 14 to an input of audio D/A converter 16, and a line 30 couples an output of audio D/A converter 16 to an input of amplifier 18. A line 32 couples an output of amplifier 18 to speaker 12.

Power supply 24, in this non-limiting example, boosts the system power provided on a power bus 34 for an amplifier 18 power bus 36. For example, power supply 24 can be a Boost Converter. Power supply 24 also provides an analog current level signal, representing the current drawn by amplifier 18, on a line 38 to the A/D converter 22.

In addition to the current level signal on line 38, in this example embodiment A/D converter 22 has another analog input coupled to line 40 to receive a measure of device temperature, e.g. by a thermistor. A/D converter 22 has a digital output coupled to a line 42 connecting the digital output of the A/D converter 22 to a digital input of brownout controller 20. Brownout controller 20 has input/output (I/O) ports coupled to a Group Brownout control bus 44 and, in some non-limiting examples, an optional control line or bus 46 coupled to the audio D/A converter 16.

Figure 2:
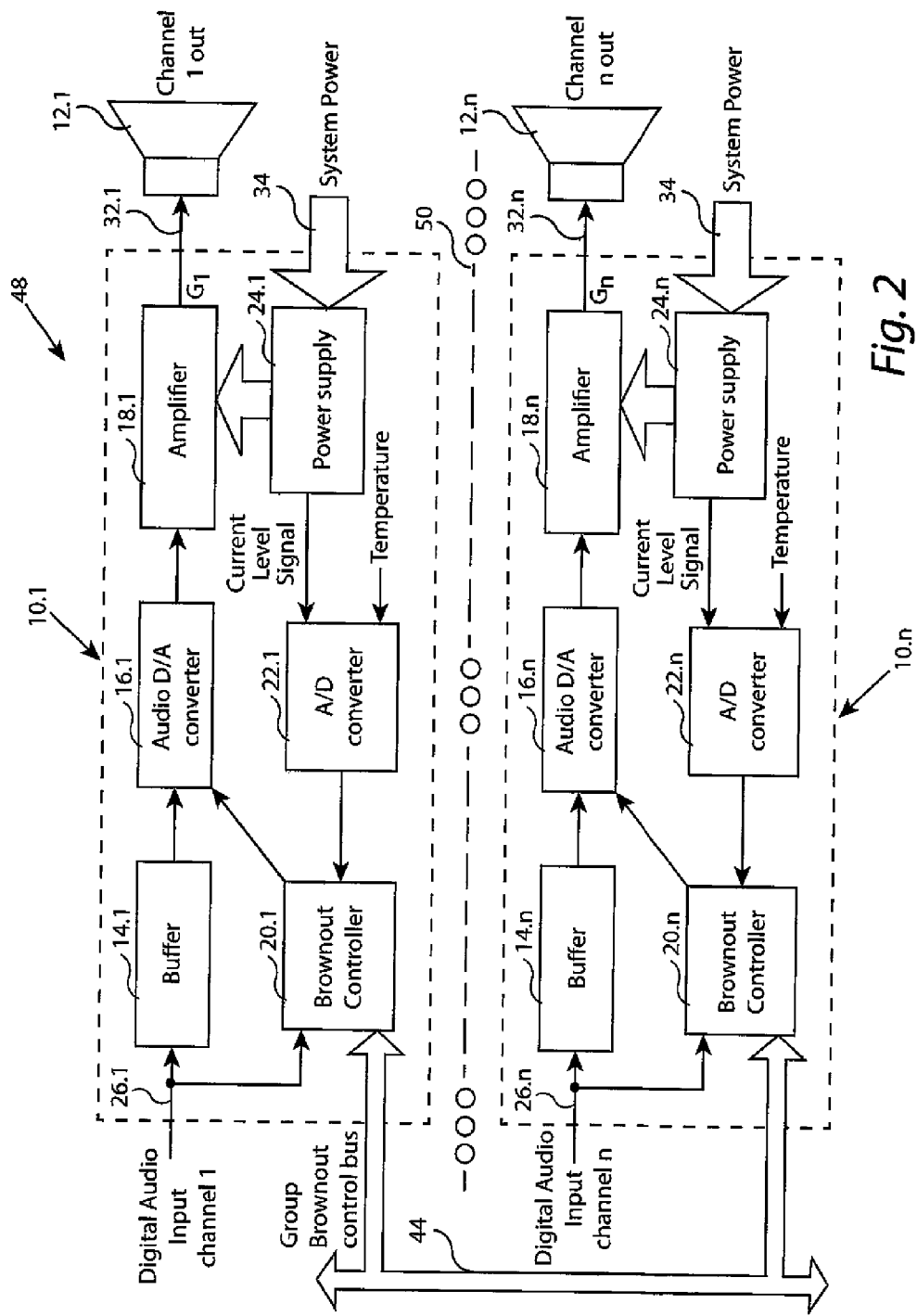
FIG. 2 is a block diagram of an example multi-channel amplifier system comprising two or more of the group-aware, current limited amplifiers of FIG. 1.

In FIG. 2, a multi-channel amplifier system includes a n group-aware, current-limited amplifier channels 10.x, where n≥2 and x is equal to 1, . . . n. In this example, each of the current-limited amplifier channels 10.x has a channel path gain $G_x$ to provide sufficient audio power to drive an associated electro-acoustic speaker 12.x. Also, each of the amplifier channels 10.x include a buffer 14.x, an audio D/A converter 16.x, an amplifier 18.x, a brownout controller 20.x, and A/D converter 22.x and a power supply 24.x. Furthermore, for the purpose of this example, a line 50 is used to represent any amplifier channels 10.x, bus connections 44, speakers 12.x, etc. that fall between amplifier channels 10.1 and 10.n.

In an embodiment, set forth by way of example and not limitation, one of the amplifier channels 10.x is designated as the master, while the remaining amplifier channels 10.x are designated as slaves. The master amplifier channel 10.x and slave amplifier channels 10.x can be configured upon system startup, or they can be configured during operation. In other embodiments, all of the amplifier channels 10.x can be slaves, and a dedicated master processor can provide coordination and control of the slave amplifier channels 10.x. In yet another embodiment, the master amplifier can also be configured to simultaneously act as a slave amplifier. The operations of the master and/or slave amplifier channels are, in this non-limiting example, under the control of the brownout controllers 20.x, which use digital logic. For example, brownout controllers can comprise state machines, discrete logic, microcontrollers, etc., to perform the functions associated with the amplifier channels 10.x. In the case of microcontrollers, program instructions may be stored in a non-transitory computer readable media (including, by way of non-limiting examples, random access memory, read only memory, flash memory, etc.) to perform the functions associated with the amplifier channels 10.x.

Figure 3:
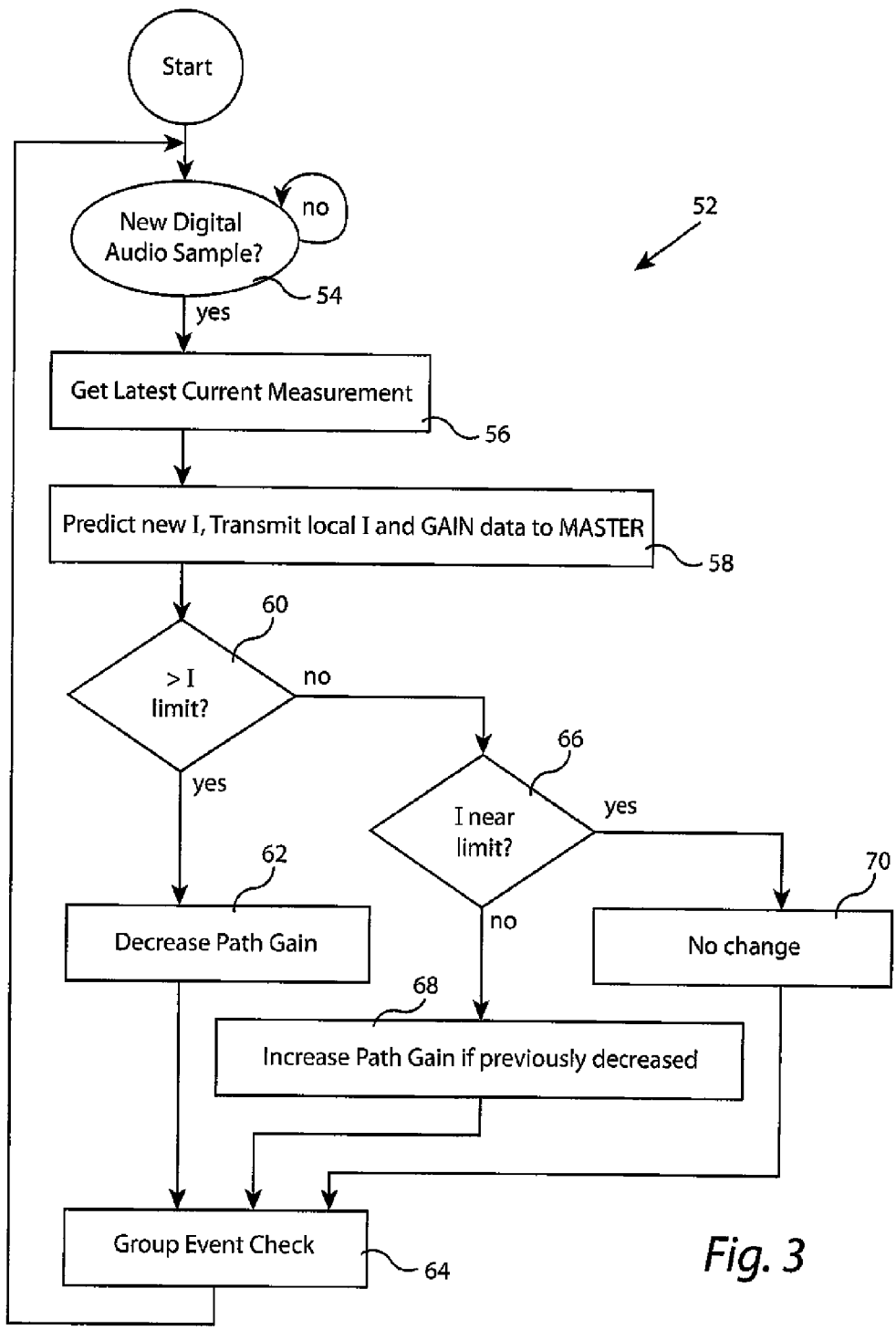
FIG. 3 is a flow diagram of a first example process implemented by a group-aware, current limited amplifier configured as a slave.

In FIG. 3, a process 52, set forth by way of example but not limitation, of a slave amplifier channel 10.x making a local check is illustrated. The purpose of this example process 52 is to ensure that the slave amplifier channel 10.x is not exceeding a local current limit (e.g. the current limit for that slave amplifier channel or a group of slave amplifier channels). Process 52 begins with waiting for a new digital audio sample to arrive in an operation 54. Operation 56 obtains the latest current measurement in an operation 56 (e.g. a digitized version of the current level signal) and, in an operation 58 predicts a new current level ("local I") and transmits the local I and GAIN data to the master amplifier channel 10.x. Next, in an operation 60, it is determined if the local I is greater than the local current limit ("local I limit") and, if so, an operation 62 decreases the path gain of the slave amplifier channel 10.x. An operation 64 of "Group Event Check" 64 is then performed, and process control is returned to operation 54 to await a new digital audio sample. The process associated with Group Event Check 64 will be discussed in greater detail with respect to FIG. 4.

If operation 60 determines that the local I is not greater than the local I limit, an operation 66 determines if it is near to the limit. If it is near to the limit, no change is made by operation 70, and process control is given to operation 64. As used herein, "near to the limit" means that it is less than the local I limit by less than a predetermined amount designated by Δ or "delta." For example, Δ can be a couple of adjustments steps, or a percentage of the local limit. If the local I is less than the local I limit and is not near the local I limit, an operation 68 increases path gain if the gain had been previously decreased (e.g. by operation 62 or operation 64), before passing control to operation 64.

Figures 4, 5:
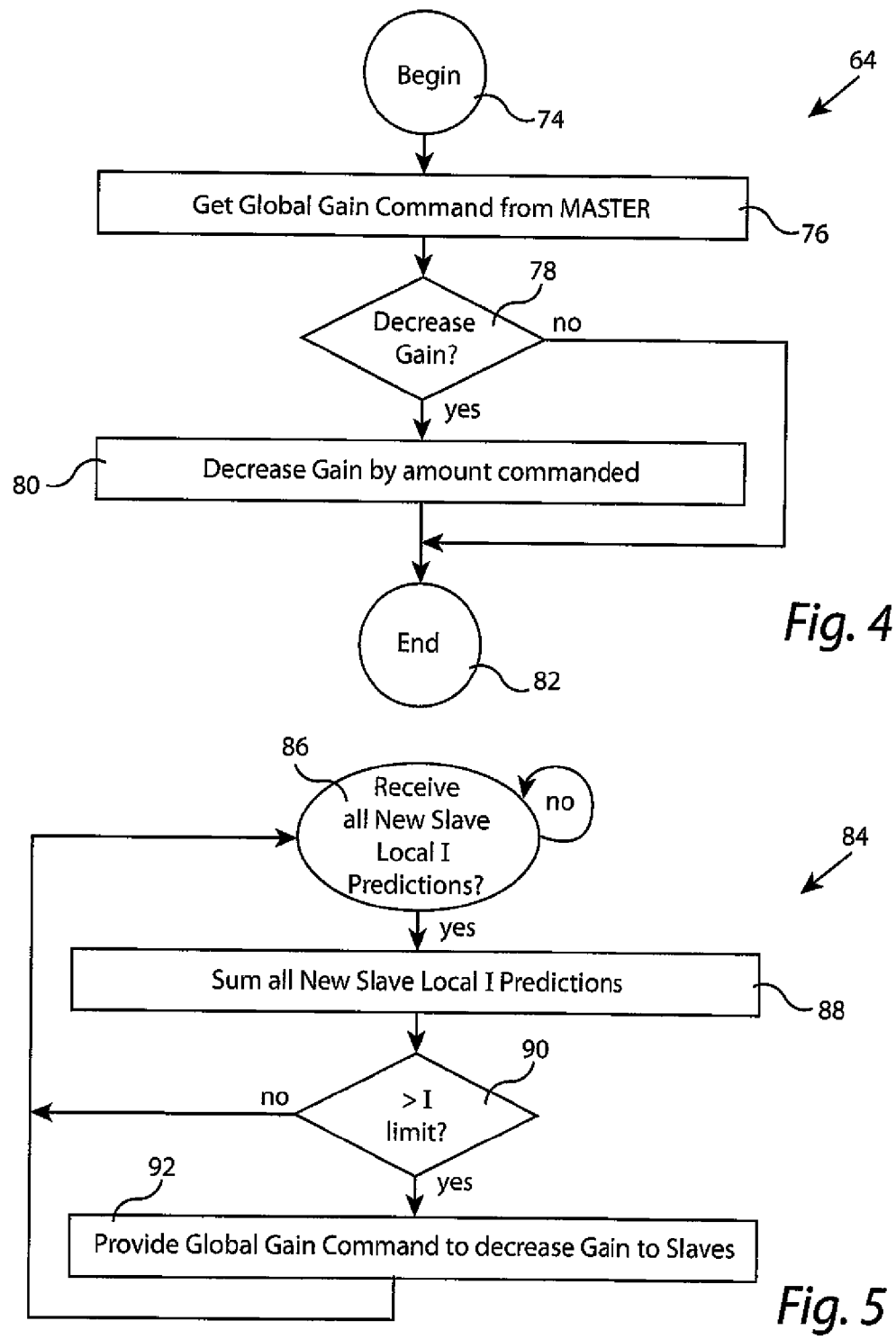
FIG. 4 is a flow diagram of a second example process implemented by a group-aware, current limited amplifier configured as a slave.
FIG. 5 is a flow diagram of an example process implemented by a group-aware, current limited amplifier configured as a master.

In FIG. 4, an example Group Event Check process 64 is discussed in greater detail. Process 64 begins at 74 and, in an operation 76, a slave amplifier channel looks for a master amplifier channel command to reduce gain, e.g. for situations where the group of amplifier channels 10.x have exceeded a group current limit. A System Gain Command is received from the master amplifier channel 10.x via the group brownout control bus 44 in this non-limiting example. An operation 78 determines if the System Gain Command is that the gain is to be decreased and, if so, an operation 80 reduces the gain of the slave amplifier channel 10.x by the amount commanded. If there has been no command to reduce the gain of the slave, or after the gain has been reduced, the Group Event Check process is completed at 82.

In FIG. 5, a process 84, set for the by way of example and not limitation, of the master amplifier channel aggregates data received from one or more slave amplifier channels and determines if a System Gain Command should be provided to the slave amplifier channels 10.x. In this non-limiting example, process 84 begins with an operation 86 where it awaits local I predictions from the slave amplifier channels 10.x. Next, an operation 88 sums the slave local I predictions and, in an operation 90, it is determined if the sum is greater that a system current limit ("System I"). In alternate embodiments, the calculation of the total current drawn by the amplifiers of the slave amplifier channels can be accomplished differently, e.g. by making a running total as Local I values as they are received from the slave amplifier channels 10.x. If so, operation 92 provides a "Decrement Path Gain" command to all of the slave amplifier channels 10.x before returning to the wait operation 86. If not, operational control returns directly to the wait operation 86 where it awaits new slave Local I Limits.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the inventions disclosed herein are interpreted in accordance with their true spirit and scope without limitation or estoppel.

What is claimed is:

1. A current-limited amplification device comprising:
   an amplifier having an analog audio input and an amplified analog audio output;
   an amplifier power supply coupled to the amplifier and developing a current level signal that represents the amount of current being drawn by the amplifier;
   a brownout controller responsive to a digital audio input and the current level signal, the brownout controller being operative to develop a control signal; and
   an audio digital-to-analog (D/A) converter responsive to the digital audio input and to the control signal, the D/A converter being operative to develop an analog audio output that is coupled to the analog audio input of the amplifier.

2. A current-limited amplification device as recited in claim 1 wherein the brownout controller is further responsive to a group brownout control bus.

3. A current-limited amplification device as recited in claim 2 further comprising an analog-to-digital (A/D) converter coupling the current level signal to the brownout controller.

4. A current-limited amplification device as recited in claim 3 further comprising a buffer coupling the digital audio input to the D/A converter.

5. A current-limited amplification device as recited in claim 4 wherein the A/D converter includes a temperature input.

6. A current-limited amplification device as recited in claim 5 wherein the amplifier power supply has a system power input.

7. A current-limited amplification device as recited in claim 6 wherein the amplifier, the amplifier power supply, the brownout controller, the D/A converter, the A/D converter, and the buffer comprise a packaged integrated circuit (IC) device including a plurality of leads.

8. A current-limited amplification device as recited in claim 7 wherein the digital audio input, the amplified audio output and the system power input are coupled to the plurality of leads of the IC device.

9. A group-aware, current limited amplifier system comprising:
   a group brownout control bus; and
   a plurality of current-limited amplification channels coupled to the group brownout control bus, each including
   (a) an amplifier having an analog audio input and an amplified analog audio output;
   (b) an amplifier power supply coupled to the amplifier and developing a current level signal that represents the amount of current being drawn by the amplifier;
   (c) a brownout controller responsive to a digital audio input, the group brownout control bus, and the current level signal, the brownout controller being operative to develop a control signal; and
   (d) an audio digital-to-analog (D/A) converter responsive to the digital audio input and to the control signal, the D/A converter being operative to develop an analog audio output that is coupled to the analog audio input of the amplifier.

10. A group-aware, current limited amplifier system as recited in claim 9 wherein each of the plurality of current-limited amplification channels further includes an analog-to-digital (A/D) converter coupling the current level signal to the brownout controller.

11. A group-aware, current limited amplifier system as recited in claim 10 wherein each of the plurality of current-limited amplification channels further includes an a buffer coupling the digital audio input to the D/A converter.

12. A group-aware, current limited amplifier system as recited in claim 11 wherein the A/D converter includes a temperature input.

13. A group-aware, current limited amplifier system as recited in claim 12 wherein the amplifier power supply has a system power input.

* * * * *